(12) United States Patent
Matsui et al.

(10) Patent No.: US 7,642,541 B2
(45) Date of Patent: Jan. 5, 2010

(54) FUNCTIONAL DEVICE AND METHOD OF MANUFACTURING IT

(75) Inventors: Eriko Matsui, Tokyo (JP); William Ford, Stuttgart (DE); Jurina Wessels, Stuttgart (DE); Akio Yasuda, Esslingen (DE); Ryuichiro Maruyama, Kanagawa (JP); Tsuyonobu Hatazawa, Tokyo (JP)

(73) Assignees: Sony Corporation, Tokyo (JP); Sony Deutschland GmbH, Berlin (DE)

( * ) Notice: Subject to any disclaimer, the term of this patent is extended or adjusted under 35 U.S.C. 154(b) by 262 days.

(21) Appl. No.: 11/538,323

(22) Filed: Oct. 3, 2006

(65) Prior Publication Data

US 2007/0200175 A1    Aug. 30, 2007

(30) Foreign Application Priority Data

Oct. 4, 2005    (JP)    ............... P2005-290823

(51) Int. Cl.
*H01L 49/00* (2006.01)
(52) U.S. Cl. ............ 257/9; 257/E49.003; 257/E51.023; 257/E51.04; 423/447.2; 977/762; 977/938
(58) Field of Classification Search ............ 257/9, 257/29, 41, E49.001–E49.004, E51.023, 257/E51.04; 423/447.1–447.2; 977/762–772, 977/936–938
See application file for complete search history.

(56) References Cited

U.S. PATENT DOCUMENTS

| | | | |
|---|---|---|---|
| 6,586,787 B1 * | 7/2003 | Shih et al. ............ | 257/288 |
| 2004/0245527 A1 * | 12/2004 | Tsukagoshi et al. ............ | 257/77 |
| 2005/0045867 A1 * | 3/2005 | Ozkan et al. ............ | 257/12 |
| 2006/0067870 A1 * | 3/2006 | Park et al. ............ | 423/447.2 |
| 2008/0017845 A1 * | 1/2008 | Drndic et al. ............ | 257/24 |

OTHER PUBLICATIONS

Collins, P.G., et al. "Engineering Carbon Nanotubes and Nanotube Circuits Using Electrical Breakdown." Science, vol. 292 (2001): pp. 706-709.*
Collins, P.G., et al. "Current Saturation and Electrical Breakdown in Multiwalled Carbon Nanotubes." Phys. Rev. Lett., vol. 86 (2001): pp. 3128-3131.*
Watanabe, E., et al. "Coulomb Blockade Oscillation in a Multiwalled Carbon Nanotube with Internanotube Tunnel Junctions." Appl. Phys. Lett., vol. 83 (2003): pp. 1429-1431.*
Smorodin, T., et al. "Contacting Gold Nanoparticles with Carbon Nanotubes by Self-Assembly." Nanotech., vol. 16 (2005): pp. 1123-1125.*
Monthioux, M. "Filling Single-Wall Carbon Nanotubes." Carbon, vol. 40 (2002): pp. 1809-1823.*

(Continued)

*Primary Examiner*—Douglas M Menz
*Assistant Examiner*—Matthew W Such
(74) *Attorney, Agent, or Firm*—K&L Gates LLP

(57) ABSTRACT

A functional device which is composed of a nanometer-sized functional structure, which can reduce connection resistance in connecting the functional structure to an external electrode, and which includes a wiring section capable of minimizing constraints given to structural designs of various functional structures, and a method of manufacturing it are provided. A functional device in which a functional structure having contained sections in positions spaced from each other is retained by a carbon nanotube. A gap is formed in the carbon nanotube, and the carbon nanotube is segmented into a first carbon nanotube and a second carbon nanotube by the gap. One of the contained sections is contained in the first carbon nanotube at an opening of the first carbon nanotube facing the gap, and the other of the contained sections is contained in the second carbon nanotube at an opening of the second carbon nanotube facing the gap.

10 Claims, 13 Drawing Sheets

OTHER PUBLICATIONS

Yamamoto et al., "Orientation of Carbon Nanotubes Using Electrophoresis," Jpn. J. Appl. Phys., vol. 35 (1996), Pt. 2, No. 7B, pp. 917-918.

All about Nanotechnology with Illustration edited by Tomoji Kawai, Kogyo Chosakai Publishing Inc., 2001, pp. 142-145.

Krupke et al., "Simultaneous Deposition of Metallic Bundles of Single-walled Carbon Nanotubes Using Ac-dielectrophoresis," Nano Letters, 2003, vol. 3, No. 8, pp. 1019-1023.

Liu et al., "Electric-field oriented carbon nanotubes in different dielectric solvents," Current Applied Hysics 4, 2004, pp. 125-128.

Nagahara et al., "Directed placement of suspended carbon nanotubes for nanometer-scale assembly," Applied Physics Letters, vol. 80, No. 20, May 20, 2002, pp. 3826-3828.

Kumar et al, "Influence of electric field type on the assembly of single walled carbon nanotubes," Chemical Physics Letters 383 (2004) pp. 235-239.

Molecular Rectifiers, Phys. Lett., , vol. 29, No. 2, 1974, p. 279, figs. 2 and 6.

Chemical Frontier 2 Carbon Nanotube edited by Kazuyoshi Tanaka, Kagaku Dojin Publishing Company, 2001, pp. 19-31.

* cited by examiner

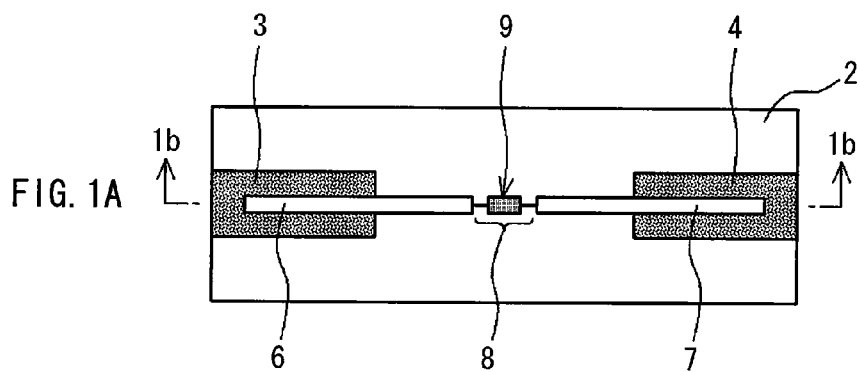
FIG. 1A
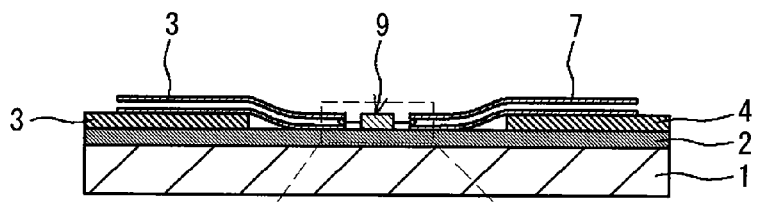
FIG. 1B
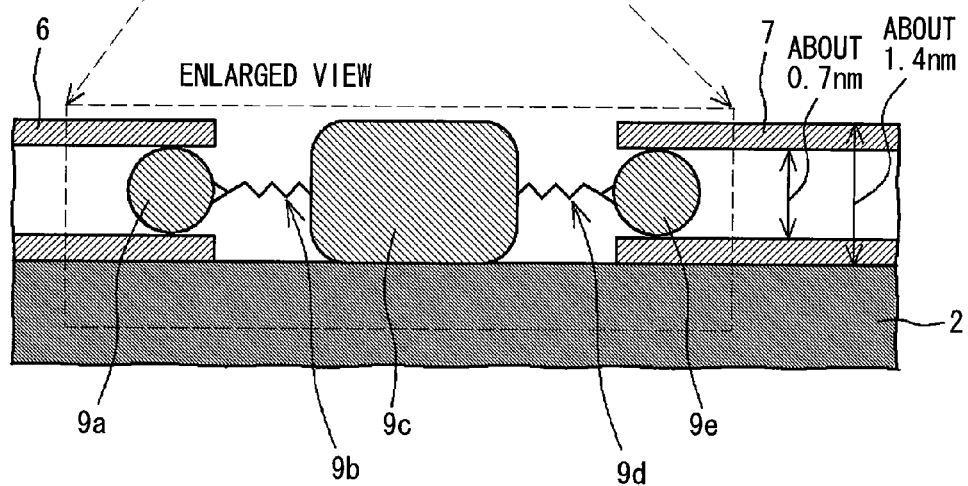

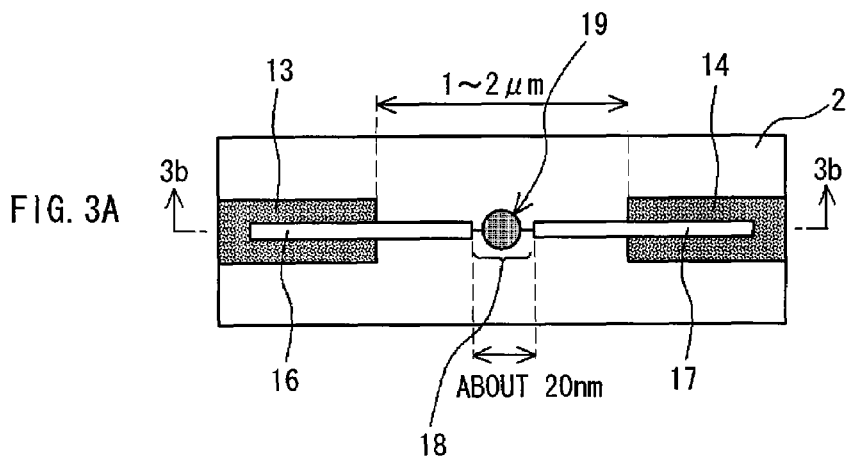
FIG. 3A
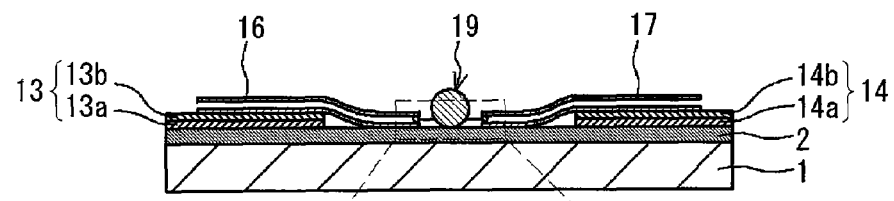
FIG. 3B
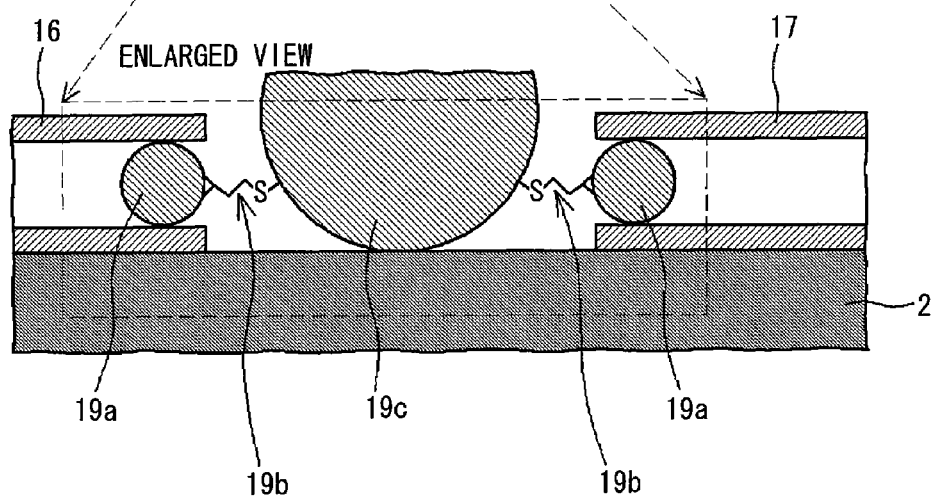

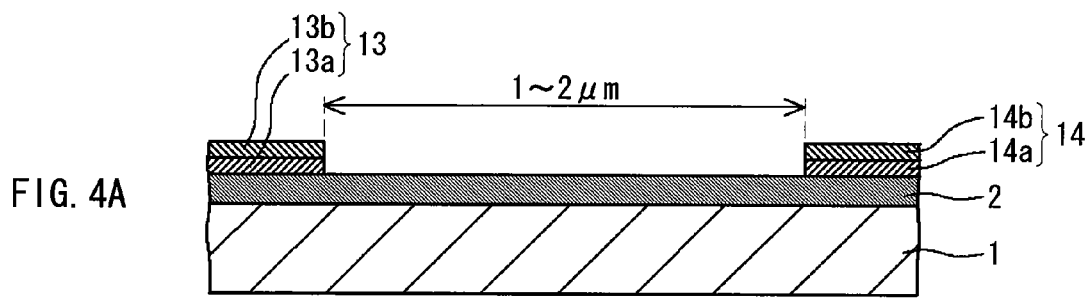
FIG. 4A
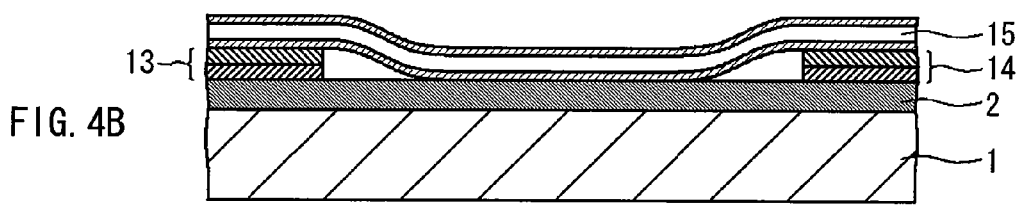
FIG. 4B
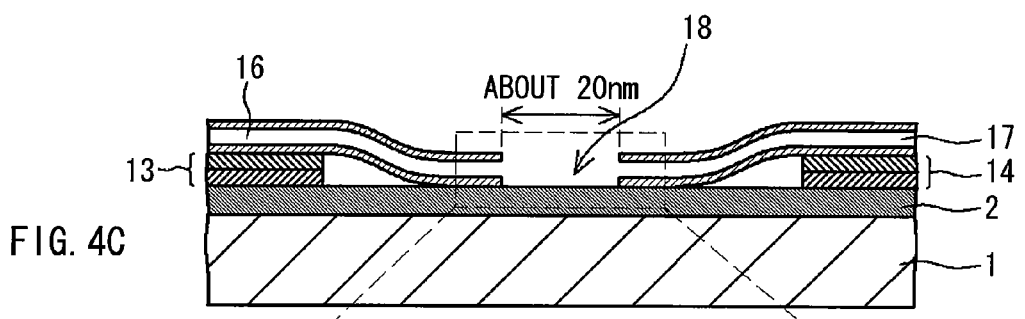
FIG. 4C
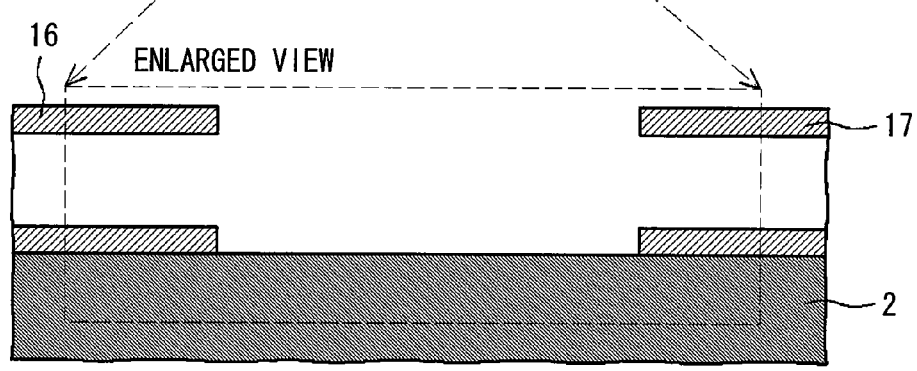

18

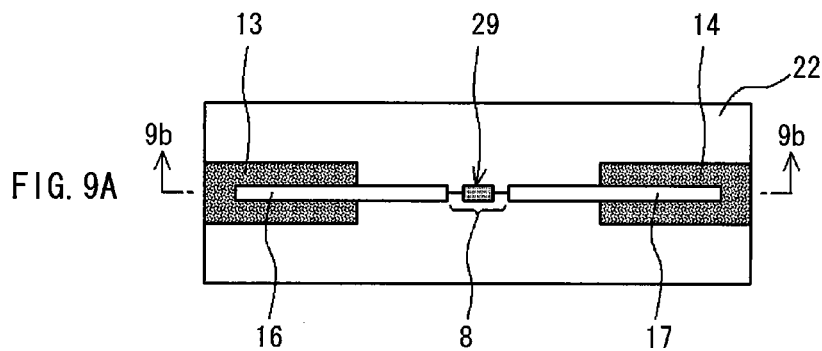
FIG. 9A
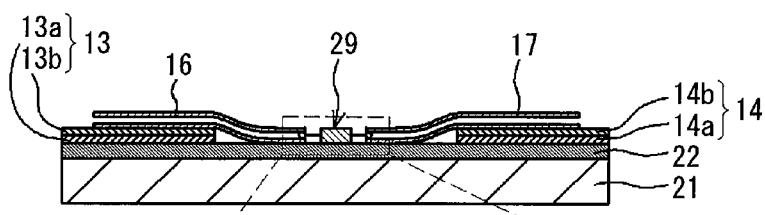
FIG. 9B
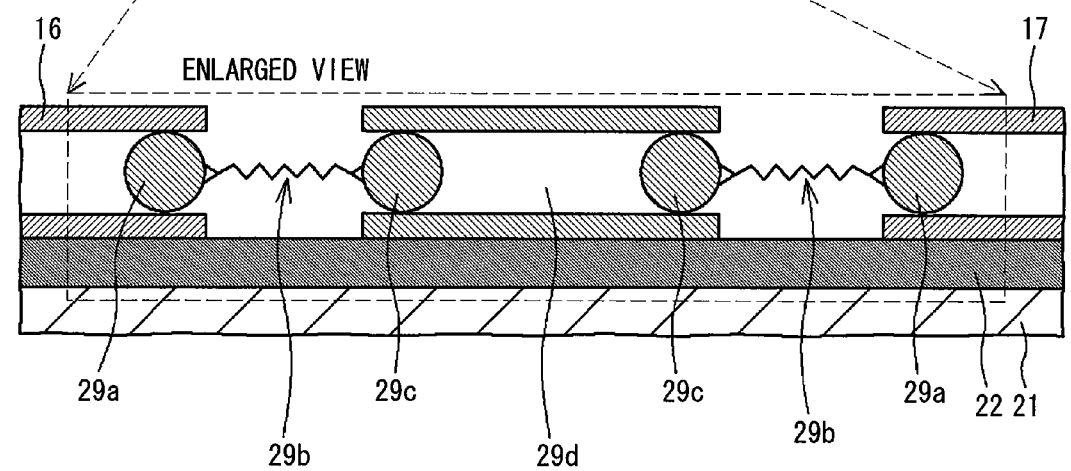

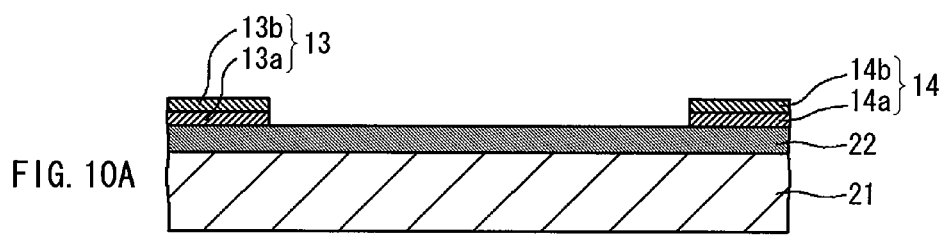
FIG. 10A
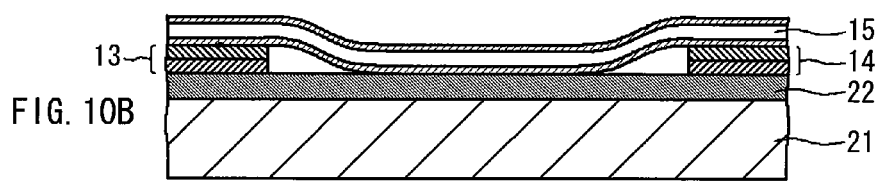
FIG. 10B
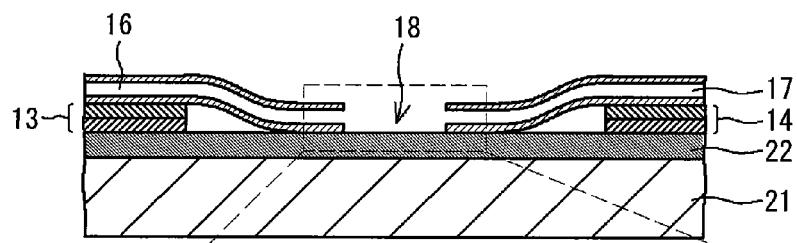
FIG. 10C
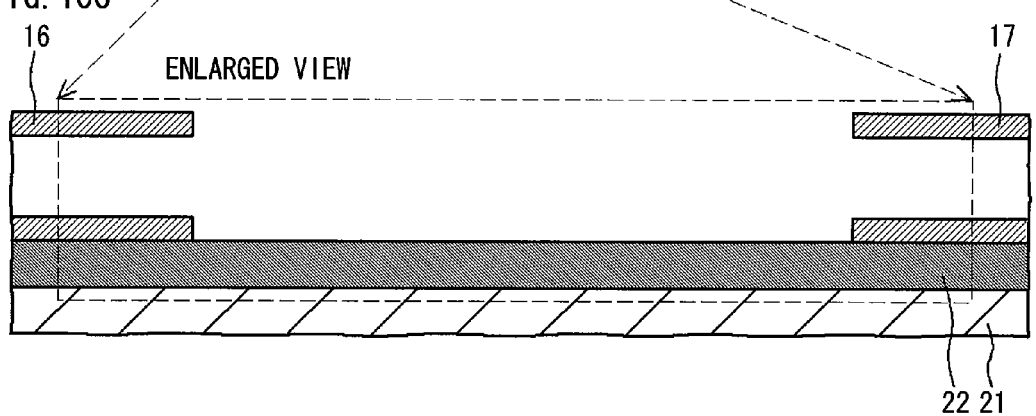
ENLARGED VIEW

FUNCTIONAL DEVICE AND METHOD OF MANUFACTURING IT

CROSS REFERENCES TO RELATED APPLICATIONS

The present application claims priority to Japanese Patent Application JP 2005-290823 filed in the Japanese Patent Office on Oct. 4, 2005, the entire contents of which is being incorporated herein by reference.

BACKGROUND

The present application relates to a functional device using a carbon nanotube as a wiring material or the like and a method of manufacturing the functional device.

Nanotechnology is a technology for observing, fabricating, and utilizing a fine structure about the size of 100 millionth meter ($10^{-8}$ m=10 nm).

In the late 1980s, an ultra-precision microscope called scanning tunneling microscope was invented. This provided the ability to observe one atom and one molecule. By using the scanning tunneling microscope, atoms and molecules can be manipulated one by one, in addition to the observation of atoms and the molecules.

For example, a case that atoms are laid out on the surface of crystals to display a letter or the like has been reported. However, even though atoms and molecules can be manipulated, it is not practical to manipulate a vast number of atoms and molecules one by one for assembling a new material and a device.

To manipulate atoms, molecules, or a population thereof to form a nanometer-sized structure, it is necessary to use a new ultra-precision processing technology. As such a nanometer-precision fine processing technology, the following two main methods have been known.

One method is a method which has been used for manufacturing various semiconductor devices in the past. Such a method is a so-called top-down method in which, for example, a large silicon wafer is precisely microfabricated to the limit to form an integrated circuit. The other method is a so-called bottom-up method in which atoms or molecules which are minimal units are used as parts, and small parts are thereby assembled to fabricate an intended nano structure.

For the limit to fabricating a small structure by the top-down method, famous Moore's Law that was presented in 1965 by Gordon Moore who is a co-founder of Intel Corporation can be cited. According to Moore's Law, the integration degree of transistors becomes twice in 18 month. As propounded in Moore's Law, the semiconductor industry has increased the integration degree of transistors for over 30 years or more since 1965.

The International Technology Roadmap for Semiconductor (ITRS) of the semiconductor industry for next 15 years, which has been announced by Semiconductor Industry Association (SIA), expresses that Moore's Law will remain in effect.

ITRS includes a short-term roadmap till 2007 and a long-term roadmap till 2016. The short-term roadmap describes that the half pitch of a DRAM (dynamic RAM) of a semiconductor chip will become 65 nm in 2007. The long-term roadmap describes that the half pitch will become 22 nm in 2016.

The finer the semiconductor chip becomes, the faster it performs and the smaller the electric consumption becomes. Further, when the semiconductor chip becomes finer, the number of products produced by one wafer increases and the production cost can be lowered. That is why microprocessor manufacturers compete with each other in the process rule of new products and the integration degree of transistors.

However, it is indicated that "Moore's Law" will reach the limit based on the natural laws in the near future.

For example, in the semiconductor technology which is a currently main stream, a circuit pattern is printed on a silicon wafer by lithography technology to manufacture semiconductor chips. To attain a finer semiconductor chip, the resolution should be increased. To increase the resolution, technology to utilize light in shorter wavelength should be put into practical use.

Further, when the integration degree is increased, the heat value per a semiconductor chip is excessively increased. In the result, there is a risk that the high-temperature semiconductor chip malfunctions or is destroyed thermally.

Further, according to prediction by professionals, if the semiconductor industry continues to decrease the size of chips, the equipment cost and the process cost will be increased, the yield is decreased, and thus the manufacturing thereof will not work out economically around 2015.

Recently, as a larger issue, an issue of fine concavity and convexity of a pattern edge, that is, line edge roughness has been pointed out. For concavity and convexity of the surface of a resist mask, a finer pattern, a size of molecules composing a resist, a diffusion length of acid in a chemically-amplified photoresist and the like are factors thereof. A relation between the cycle size of concavity and convexity of a pattern edge and device characteristics has been evaluated, and has become an important task.

As a new technology for overcoming the foregoing technological obstacles in the top-down method, researches to provide individual molecules with a function as electronic parts have attracted attentions. In this case, an electronic device (molecular switch or the like) composed of a single molecule is fabricated by bottom-up method.

For a metal, ceramics, and a semiconductor, researches to fabricate a nanometer-sized structure by bottom-up method have been made as well. However, molecules are originally independent from each other, and there are millions of various types of molecules with different shapes and functions. If such original characteristics of molecules are utilized, a functional device having characteristics totally different from those of the existing devices (functional molecular structure device) can be designed and fabricated by bottom-up method.

For example, Aviram and Ratner have presented a concept of a molecular rectifier which is fabricated by using only a molecule in "Molecular Rectifiers" (A. Aviram and M. A. Ratner, Chem, Phys. Lett., 29, 277 (1974) (p. 279, FIGS. 2 and 6) in 1974.

The functional structure device (abbreviated as functional device) using a molecule and a particulate of a metal or a semiconductor as a functional material is promising and useful. However, if there is no breakthrough in forming a wiring which connects such a small functional structure to an external electrode, major obstacles will occur in designing a functional device utilizing characteristics of a nanometer-sized functional structure.

For example, in the above-cited concept by Aviram and Ratner, a wiring between the molecular rectifier and an external electrode is formed by connecting conductive organic molecules by covalent bond, and a whole device is structured as a molecular device composed of one large molecule. However, when all wirings are formed of the conductive organic molecule, the synthetic pathway is complicated, leading to a restriction for realizing a molecular device having various characteristics.

SUMMARY

In view of foregoing, it is desirable to provide a functional device which is composed of a nanometer-sized functional structure, and includes a wiring means capable of reducing connection resistance in connecting the functional structure to an external electrode and of minimizing restrictions on structural designs of various functional structures, and a method of manufacturing the functional device.

According to an embodiment, there is provided a functional device in which a functional structure having contained sections in positions spaced from each other is retained by a carbon nanotube, wherein a gap is formed in the carbon nanotube, and the carbon nanotube is segmented into a first carbon nanotube and a second carbon nanotube by the gap, and one of the contained sections is contained in the first carbon nanotube at an opening of the first carbon nanotube facing the gap, and the other of the contained sections is contained in the second carbon nanotube at an opening of the second carbon nanotube facing the gap.

According to an embodiment, there is provided a first method of manufacturing the functional device including the steps of: arranging a carbon nanotube so that the carbon nanotube contacts with opposed electrodes and bridges at least a clearance between the electrodes; forming a gap in the carbon nanotube between the opposed electrodes and segmenting the carbon nanotube into a first carbon nanotube and a second carbon nanotube by the gap; containing one of contained sections included in a first conductive linkage group precursor in the first carbon nanotube at an opening of the first carbon nanotube facing the gap, and containing the other of the contained sections included in a second conductive linkage group precursor in the second carbon nanotube at an opening of the second carbon nanotube facing the gap; and reacting the first conductive linkage group precursor and the second conductive linkage group precursor to a functional structural part, and forming the functional structure in which the one of the contained sections and the other of the contained sections are respectively linked to the functional structural part by a first conductive linkage group and a second conductive linkage group.

According to an embodiment, there is provided a second method of manufacturing the functional device including the steps of: arranging a carbon nanotube so that the carbon nanotube contacts with opposed electrodes, and bridges at least a clearance between the electrodes; forming a gap in the carbon nanotube between the opposed electrodes, and segmenting the carbon nanotube into a first carbon nanotube and a second carbon nanotube by the gap; forming a functional structure in which one of contained sections and the other of the contained sections are respectively linked to a functional structural part by a conductive linkage group; and containing the one of the contained sections in the first carbon nanotube at an opening of the first carbon nanotube facing the gap, and containing the other of the contained sections in the second carbon nanotube at an opening of the second carbon nanotube facing the gap.

According to the functional device of the embodiment, the functional structure is retained by the carbon nanotube in the gap formed in the carbon nanotube. Therefore, by appropriately arranging the carbon nanotube and forming the gap in a given position, the functional structure can be automatically arranged in the given position. Then, since the carbon nanotube has conductivity, the carbon nanotube can be utilized as a wiring section for connecting the functional structure to an external electrode with small connection resistance. In the result, it is possible to replace the difficult task to arrange various nanometer-sized functional structures in a given position and the difficult task to form electrical connection for the functional structure with much easier task to arrange the carbon nanotube in a given position and form electrical connection in the carbon nanotube.

Further, the one of the contained sections and the other of the contained sections are respectively contained in the first carbon nanotube and the second carbon nanotube at the openings facing the gap. Thereby, the functional structure is retained by the carbon nanotube. Such a step does not need complex chemical reaction. Therefore, while constraints given to the structural design of the functional structure are minimized, the functional structure can be bonded to the first carbon nanotube and the second carbon nanotube. Further, by selecting, for example, a contained section having an outer diameter appropriate to the internal diameter of the first carbon nanotube and the second carbon nanotube as the contained section, it is possible to reduce the connection resistance between the first carbon nanotube, the second carbon nanotube and the functional structure.

The first and the second methods of manufacturing the functional device according to the embodiments include the steps of: arranging the carbon nanotube so that the carbon nanotube contacts with the opposed electrodes and bridges at least the clearance between the electrodes; and forming the gap in the carbon nanotube between the opposed electrodes and segmenting the carbon nanotube into the first carbon nanotube and the second carbon nanotube by the gap. Therefore, the foregoing task to arrange the carbon nanotube in an appropriate position and form electrical connection in the carbon nanotube is resolved.

Furthermore, the first method of manufacturing the functional device according to the embodiment includes the steps of: containing the one of the contained sections included in the first conductive linkage group precursor in the first carbon nanotube at the opening of the first carbon nanotube facing the gap, and containing the other of the contained sections included in the second conductive linkage group precursor in the second carbon nanotube at the opening of the second carbon nanotube facing the gap; and reacting the first conductive linkage group precursor and the second conductive linkage group precursor to the functional structural part, and forming the functional structure in which the one of the contained sections and the other of the contained sections are respectively linked to the functional structural part by the first conductive linkage group and the second conductive linkage group. Therefore, the first carbon nanotube and the second carbon nanotube as a wiring section can be bonded to the functional structure by simple chemical steps while constraints given to the structural design of the functional structure are minimized.

Similarly, the second method of manufacturing the foregoing functional device according to the embodiment includes the steps of: forming the functional structure in which the one of contained sections and the other of the contained sections are respectively linked to the functional structural part by the conductive linkage group; and containing the one of the contained sections in the first carbon nanotube at the opening of the first carbon nanotube facing the gap, and containing the other of the contained sections in the second carbon nanotube at the opening of the second carbon nanotube facing the gap. Therefore, the first carbon nanotube and the second carbon nanotube as a wiring section can be bonded to the functional structure by simple chemical steps while constraints given to the structural design of the functional structure are minimized.

Additional features and advantages are described herein, and will be apparent from, the following Detailed Description and the figures.

BRIEF DESCRIPTION OF THE FIGURES

FIGS. 1A and 1B are respectively a plan view and a cross section showing an example of a functional device according to an embodiment.

FIGS. 3A and 3B are respectively a plan view and a cross section of a functional device according to a first embodiment of an embodiment.

FIGS. 4A to 4C are cross sections showing a flow of steps of fabricating the functional device according to an embodiment.

FIGS. 9A and 9B are respectively a plan view and a cross section of a functional device according to an embodiment.

FIGS. 10A to 10C are cross sections showing a flow of steps of fabricating the functional device according to an embodiment.

DETAILED DESCRIPTION

Figure 2:
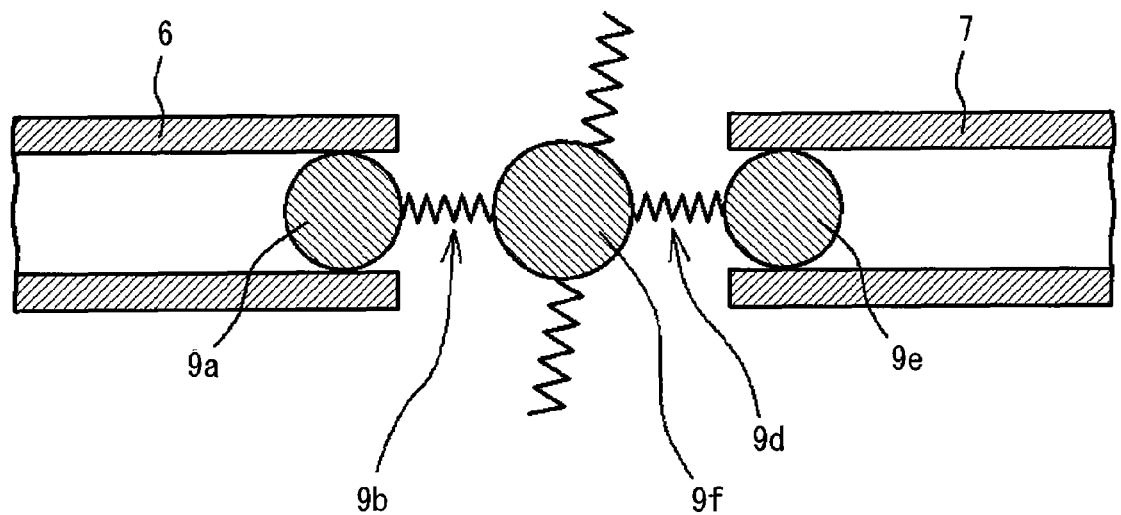
FIG. 2 is a cross section showing an example of a functional device structured as a switch according to an embodiment.

A description of various embodiments in detail with reference to the drawings follows.

In the functional device according to the embodiment of the invention, it is preferable that a functional structure having fullerene cores at both ends of the functional structure as the contained sections is retained by a metallic carbon nanotube. The metallic carbon nanotube is arranged so that the metallic carbon nanotube contacts with opposed electrodes and bridges at least a clearance between the electrodes. The gap is formed in the metallic carbon nanotube between the opposed electrodes. One of the fullerene cores is contained in the first carbon nanotube at an opening of the first carbon nanotube facing the gap, and the other of the fullerene cores is contained in the second carbon nanotube at an opening of the second carbon nanotube facing the gap.

According to the foregoing functional device, the metallic carbon nanotube is arranged so that the metallic carbon nanotube contacts with opposed electrodes and bridges at least the clearance between the electrodes. Therefore, the foregoing task to arrange the carbon nanotube in an appropriate position and form electrical connection in the carbon nanotube is resolved. At this time, since the metallic carbon nanotube with superior conductivity is used as the carbon nanotube, the functional structure is electrically connected to the opposed electrodes as an external electrode with small connection resistance. Further, once the fullerene core as the contained section is contained in the first carbon nanotube or the second carbon nanotube, the fullerene core is hardly desorbed. Therefore, a stable functional device can be formed. Further, by using the fullerene core having an appropriate external diameter corresponding to the internal diameter of the first and the second carbon nanotubes, connection resistance between the functional structure and the first and the second carbon nanotubes can be reduced.

Further, the foregoing functional device is preferably structured as a resistive element. In this case, the functional structure preferably includes a fine particle of a metal or a semiconductor, the fullerene core, and a conductive linkage group for linking the fine particle to the fullerene core. Otherwise, the functional structure preferably includes a fine particle of a metal or a semiconductor, the fullerene core, and a linkage group for linking the fine particle to the fullerene core. Otherwise, the functional structure preferably includes a fine particle of a metal or a semiconductor and the fullerene core directly bonded thereto.

Further, the foregoing functional device is preferably structured as an active device which can control conductivity. For example, the foregoing functional device is preferably structured as a switch or an insulated gate field effect transistor in which a gate electrode is provide in a region between opposed electrodes, and conductivity of the functional structure is controlled by potential of the gate electrode.

In the functional device as the foregoing resistive element or the foregoing insulated gate field effect transistor, the functional structure preferably includes a semiconductive carbon nanotube, the fullerene core, and a conductive linkage group for linking the semiconductive carbon nanotube to the fullerene core. In this case, the semiconductive carbon nanotube may be a general p-type carbon nanotube into which oxygen is absorbed, or an n-type carbon nanotube obtained by desorbing oxygen. Otherwise, the semiconductive carbon nanotube may be a carbon nanotube which becomes a p-type carbon nanotube or a n-type carbon nanotube by containing other ions or molecules. A method of linking the semiconductive carbon nanotube to the conductive linkage group is not particularly limited. However, again, the characteristics that the fullerene core is stably contained in the carbon nanotube are preferably utilized, since thereby the functional device can be easily fabricated.

In the methods of manufacturing a functional device according to the embodiments of the invention, it is preferable that by applying an AC voltage between the opposed electrodes, the carbon nanotube is oriented and arranged so that the carbon nanotube bridges between the electrodes.

Further, it is preferable that by applying a voltage between the opposed electrodes, the gap is formed in the carbon nanotube between the opposed electrodes.

A description will be hereinafter given of embodiments of the invention specifically with reference to the drawings.

FIG. 1A is a plan view and FIG. 1B is a cross section showing an example of a functional device according to the invention. FIG. 1B is a cross section taken along line 1b-1b of FIG. 1A. A partial enlarged view of a region indicated by dotted line is additionally shown in the lower part of FIG. 1B.

As shown in FIGS. 1A and 1B, an insulating layer 2 is formed on a substrate 1. As an external electrode, an electrode 3 and an electrode 4, which are opposed electrodes, are pattern-formed on the insulating layer 2. The functional device includes a carbon nanotube (CNT) 6 as the first carbon nanotube, a carbon nanotube (CNT) 7 as the second carbon nanotube, and a functional structure 9.

First, one carbon nanotube (not shown) as the carbon nanotube is arranged so that the carbon nanotube contacts with the electrode 3 and the electrode 4 and bridges a clearance between the electrodes 3 and 4. The carbon nanotubes 6 and 7 are produced by forming a gap 8 to segment the carbon nanotube into two sections. In FIG. 1B, a case that the carbon nanotube 6 and the carbon nanotube 7 are completely segmented is shown. However, it is possible that a wall face of the carbon nanotube slightly remains in the gap 8, and the carbon nanotube 6 and the carbon nanotube 7 are connected to each other with the wall face in between.

As shown in the partial enlarged view in FIG. 1B, the functional structure 9 includes one contained section 9a, a conductive linkage group 9b, a functional structural part 9c, a conductive linkage group 9d, and the other contained section 9e. The one contained section 9a is contained in the carbon nanotube 6 at an opening of the carbon nanotube 6 facing the gap 8. The other contained section 9e is contained in the carbon nanotube 7 at an opening of the carbon nanotube 7 facing the gap 8. In the result, the functional structure 9 is provided between the carbon nanotube 6 and the carbon nanotube 7.

A single-layer metallic carbon nanotube is particularly preferable for the carbon nanotubes 6 and 7, since it has a good conductivity, although it is not limited. In this specification, when a nonmetal substance shows electrical conductivity as high as that of a metal due to motion of delocalized p electron, such a state is regarded as "the substance is metallic." The single-layer carbon nanotube has a structure corresponding to the structure obtained by cutting a graphene sheet formed of a network structure in which a six-fold-ring of carbon atoms forming a benzene ring is linked to each other in a state of a plane into a rectangle, and rolling the rectangle-shaped graphene sheet in a state of a cylinder so that respective long sides of the rectangle are overlaid on each other. At this time, the molecular structure of the carbon nanotube subtly varies depending on how to roll the sheet. The electrical characteristics thereof are changed from semiconductive to metallic (refer to "Chemical Frontier 2 Carbon Nanotube," edited by Kazuyoshi Tanaka, Kagaku Dojin Publishing Company, 2001, pp. 19-31).

The contained sections 9a and 9e are not particularly limited as long as the contained sections 9a and 9e can be contained in the carbon nanotubes 6 and 7. However, for the contained sections 9a and 9e, a substance which is favorably electrically connected to the carbon nanotubes 6 and 7 such as fullerene is preferably used. Since the typical internal diameter of the carbon nanotubes 6 and 7 is about 0.7 nm, fullerene with a size capable of being adjusted to the above typical internal diameter, which can be contacted with the internal wall of the carbon nanotubes 6 and 7 such as fullerene $C_{60}$ is particularly preferable.

The conductive linkage groups 9b and 9d are not particularly limited as long as the conductive linkage groups 9b and 9d have conductivity. A polydiacetylene group (=CH—C≡C—CH=)$_n$ or the like is preferable since such a group has favorable conductivity (refer to "All about Nanotechnology with Illustration," generally edited by Tomoji Kawai, Kogyo Chosakai Publishing Inc., 2001, pp. 142-145).

The functional structural part 9c is not particularly limited. For structuring a resistive element which is a passive device, the functional structural part 9c is preferably a fine particle of a metal or a semiconductor. For structuring an active device such as a device having a switching function to turn on/off a current, a molecular device having a function to turn on/off a current by action of electric field as shown in FIG. 2 as a model or the like is preferable.

For the foregoing functional device, a description will be given more specifically with the following two illustrative examples.

ILLUSTRATIVE EXAMPLE

In an embodiment, a functional device structured as a resistive element and a method of manufacturing it will be described.

FIG. 3A is a plan view and FIG. 3B is a cross section of the functional device according to the first embodiment. FIG. 3B is a cross section taken along line 3b-3b of FIG. 3A. A partial enlarged view of a region indicated by dotted line is additionally shown. In this specification, for the members which are provided for the same purpose and have equal functions within the scope of the invention, the same referential numbers are affixed thereto even if the shape and the size slightly differ.

As shown in FIGS. 3A and 3B, the insulating layer 2 is formed on the substrate 1. As an external electrode, an electrode 13 and an electrode 14, which are opposed electrodes, are pattern-formed on the insulating layer 2. Materials of the substrate 1 and the insulating layer 2 are not particularly limited, and materials generally used as a substrate and an insulating layer can be respectively used.

The electrodes 13 and the electrode 14 are, for example, preferably formed of a two-layer structure of Ti/Pd in which a titanium (Ti) layer and a palladium (Pd) layer are layered in this order. By such a lamination structure, contact characteristics to the insulating layer 2 as a base and favorable ohmic contact characteristics to metallic carbon nanotubes 16 and 17 can be achieved. The distance between the electrode 13 and the electrode 14 is, for example, 1 to 2 μm.

The functional device includes the single-layer metallic carbon nanotube 16 as the first carbon nanotube, the single-layer metallic carbon nanotube 17 as the second carbon nanotube, and a functional structure 19. As described above, the metallic carbon nanotubes 16 and 17 are originally one metallic carbon nanotube (not shown) which is arranged so that the metallic carbon nanotube contacts with the electrode 13 and the electrode 14 and bridges a clearance therebetween. The metallic carbon nanotubes 16 and 17 are segmented by the formation of a gap (nano gap) 18. The length of the gap (nano gap) 18 is, for example, about 20 nm.

As shown in the partial enlarged view in FIG. 3B, the functional structure 19 is composed of two fullerene cores 19a such as $C_{60}$ as one contained section and the other contained section, two conductive linkage groups 19b, and a conductive fine particle 19c as a functional structural part. Two fullerene cores 19a are respectively contained in the metallic carbon nanotubes 16 and 17 at the openings thereof facing the gap 18. In the result, the functional structure 19 is retained between the metallic carbon nanotube 16 and the metallic carbon nanotube 17.

The conductive particle 19c is preferably a fine particle of a metal (simple substance or an alloy) or a semiconductor which has a diameter corresponding to the length of the gap (nano gap) 18 such as about a diameter of 20 nm. An appropriate selection of a material of the conductive fine particle 19c makes possible to form a resistive element having a given resistance. Further, the functional device can be only a connection wiring. In this case, the conductive fine particle 19c is preferably made of gold or the like.

FIGS. 4A to 5B are cross sections showing a flow of steps of fabricating the functional device according to this embodiment.

First, as shown in FIG. 4A, the insulating layer 2 is formed on the surface of the substrate 1 such as a silicon substrate by a method such as thermal oxidation. Next, an electrode material layer composed of, for example, a two-layer structure of Ti/Pd in which a titanium layer and a palladium layer are layered in this order is formed on the whole face. After that, patterning is provided by photolithography or the like to form the electrode 13 and the electrode 14 which are opposed to each other. The distance between the electrode 13 and the electrode 14 is, for example, 1 to 2 μm.

Next, as shown in FIG. 4B, the metallic carbon nanotube 15 is arranged so that the metallic carbon nanotube 15 contacts with the electrode 13 and the electrode 14 and bridges the clearance therebetween.

Specifically, first, a single-layer metallic carbon nanotube is fabricated by laser ablation method by using a nickel/cobalt (Ni/Co) fine particle as a catalyst. A mixture of the powder thereof and dimethylformamide (DMF) as a solvent is provided with ultrasonic treatment for about 10 hours. Thereby, a dispersion liquid in which the metallic carbon nanotube is uniformly dispersed in DMF is prepared.

Next, the electrode 13, the electrode 14, and the insulating layer 2 between the electrodes 13 and 14 are coated with the foregoing dispersion liquid. In this state, a voltage is applied between the electrode 13 and the electrode 14. The metallic carbon nanotube 15 in the dispersion liquid is oriented to bridge the clearance between the electrodes 13 and 14. After that, DMF as a solvent is evaporated.

It has been already known that a metallic carbon nanotube can be oriented between electrodes with high probability by applying electric field to a dispersion liquid in which the metallic carbon nanotube is dispersed (refer to K, Yamamoto, S. Akita, and Y. Nakayama, Jpn. J. Appl. Phys., 35, L917 (1996); L. A. Nagahara, I. Amlani, J. Lewenstein, and R. K. Tsui, Appl. Phys. Lett., 80, 3826 (2002); R. Krupke, F. Hennrich, H. B. Weber, M. M. Kappes, H. v. Lohneysen, Nano Lett., 3, 1019 (2003); M. S. Kumar, T. H. Kim, S. H. Lee, S. M. Song, J. W. Yang, K. S. Nahm, and E. -K. Suh, Chem. phys. Lett., 383, 235 (2004); and X. Liu, J. L. Spencer, A. B. Kaiser, W. M. Arnold, Curr. Appl. Phys., 4, 125 (2004)).

In general, there is a difference in polarizability between a metallic carbon nanotube and a semiconductive carbon nanotube. The metallic carbon nanotube has larger polarizability. Therefore, when a voltage is applied between electrodes, the metallic carbon nanotube tends to respond to the electric field better and is oriented between the electrodes more easily than the semiconductive carbon nanotube. The foregoing dispersion liquid in which the metallic carbon nanotube is dispersed in DMF also includes a semiconductive carbon nanotube or the like as impurity. However, by applying a voltage at a level with which the metallic carbon nanotube is sufficiently oriented and the semiconductive carbon nanotube is not oriented, only the metallic carbon nanotube can be selectively oriented between the electrode 13 and the electrode 14.

When an applied voltage is a DC voltage, a carbon nanotube is attracted to one electrode, and a ratio of the carbon nanotube arranged between electrodes is small. Meanwhile, when an AC voltage is applied, the carbon nanotube is not attracted to one electrode. Therefore, in this case, the carbon nanotube is arranged in a state that the carbon nanotube bridges a clearance between the electrodes effectively.

When an AC voltage is applied, the forces toward one end and the other end of the carbon nanotube alternately act on each section of the carbon nanotube. The carbon nanotube responds to the forces at a high speed. In the result, the higher the frequency of the applied AC voltage is, the less variations in orientation in the molecule is. Thus, forming a curved carbon nanotube to be straightly directed in the direction orthogonal to the opposed faces of the electrodes highly acts. When a DC voltage or an AC voltage with relatively low frequency is applied, considerable number of carbon nanotubes is arranged diagonally to the opposed faces of the electrodes. Meanwhile, when the higher frequency is applied, the number of carbon nanotubes arranged diagonally to the opposed faces of the electrodes reduces and the number of the carbon nanotubes arranged orthogonal to the opposed faces of the electrodes increases. Further, the higher the frequency is, the smaller the act on a granular carbon fine particle as impurity becomes and the higher the act on selectively orienting particularly only the metallic carbon nanotube between the electrode 13 and the electrode 14 becomes.

As described above, as a voltage to be applied, an AC voltage is desirable, and in particular the AC voltage with relatively high frequency is more desirable rather than a DC voltage. However, when the voltage with high frequency to which the carbon nanotube is not able to respond is used, it is difficult to obtain effects. Therefore, the AC voltage with appropriate frequency of about 1 MHz is most desirable.

Consequently, to selectively orient only the metallic carbon nanotube 15 between the electrode 13 and the electrode 14, the AC voltage of about 1 V with frequency of about 1 MHz is preferably applied for about 30 sec.

Figure 6A:
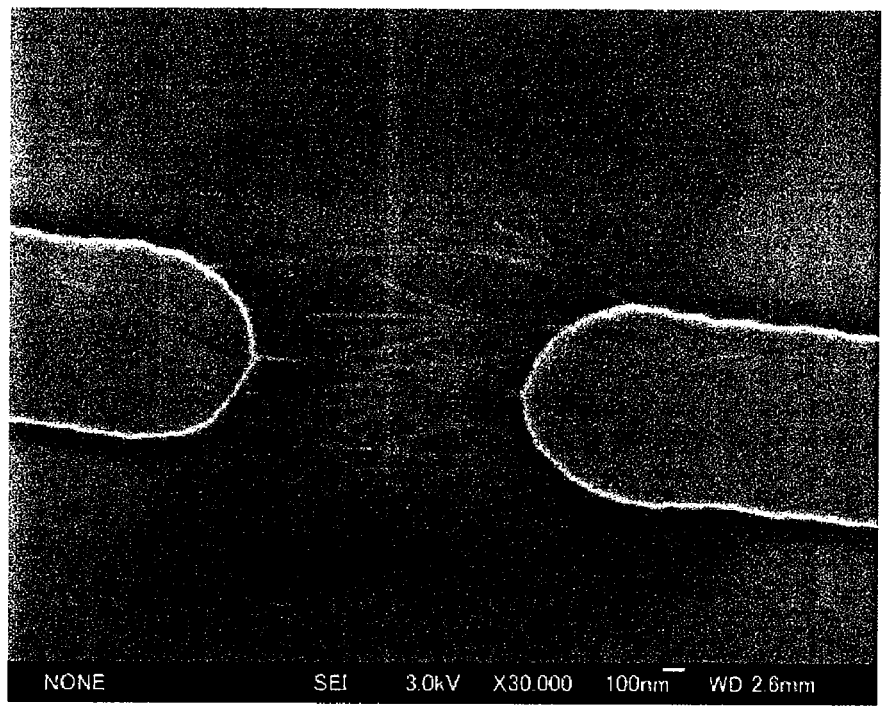
FIGS. 6A and 6B are scanning electron microscope photographs of a carbon nanotube oriented on opposed electrodes according to an embodiment.

FIG. 6A shows a scanning electron microscope photograph of the metallic carbon nanotube 15. The metallic carbon nanotube 15 is obtained by applying the AC voltage of 1 V with frequency of 1 MHz for 30 sec, and then evaporating DMF as a solvent, and orienting the metallic carbon nanotube 15 to bridge the clearance between the electrode 13 and the electrode 14 as opposed electrodes. From the photograph, it is found that the metallic carbon nanotube 15 is arranged to bridge the clearance between the electrode 13 and the electrode 14. It is needless to say that orientation is not established without application of electric field. When a D.C. current is applied, as described above, it is not possible to orient the metallic carbon nanotube 15 between the electrodes. In the photograph of FIG. 6A, a plurality of metallic carbon nanotubes 15 bridge the clearance between the electrode 13 and the electrode 14. The number of metallic carbon nanotube 15 can be controlled by adjusting concentration of the dispersion liquid of the metallic carbon nanotube.

Next, the AC voltage of about 5 V with frequency of about 100 Hz is applied between the electrode 13 and the electrode 14 to burn off part of the metallic carbon nanotube 15, and thereby the gap (nano gap) 18 is formed in the metallic carbon nanotube 15 as shown in FIG. 4C. In the result, the metallic carbon nanotube 15 is segmented into the metallic carbon nanotube 16 as the first carbon nanotube and the metallic carbon nanotube 17 as the second carbon nanotube. The length of the gap (nano gap) 18 is, for example, about 20 nm.

Figure 6B:
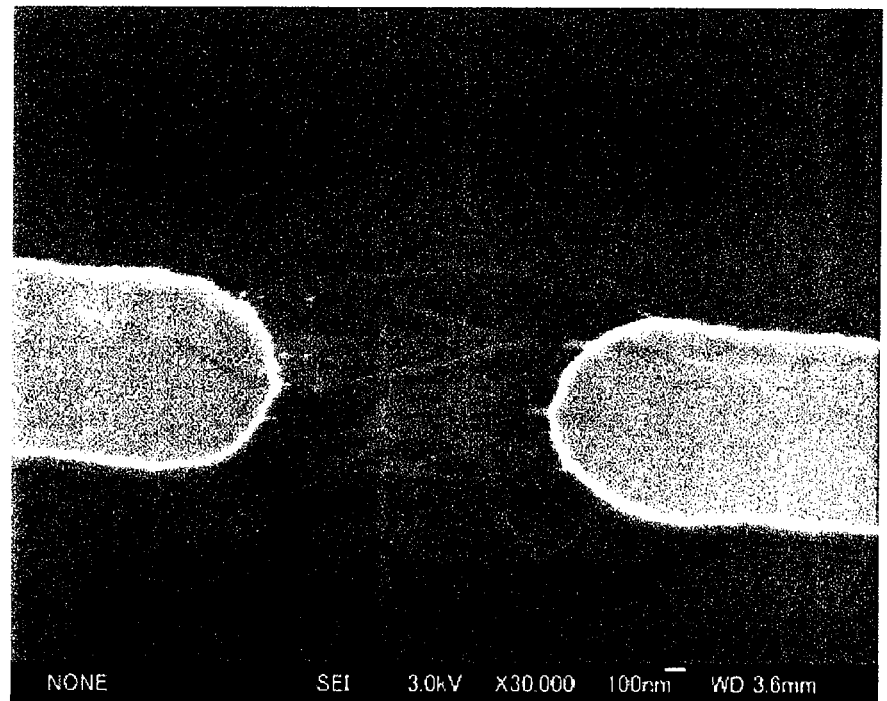

FIG. 6B shows a scanning electron microscope photograph of the metallic carbon nanotube 15. In the metallic carbon nanotube, the gap 18 is formed by applying the AC voltage of 5 V with frequency of 100 Hz to burn off part of the metallic carbon nanotube 15. It is publicly known that the gap can be formed by applying a voltage to flow a current to the metallic carbon nanotube. The inventors of the present invention have repeated experiments under various conditions, and have clarified that a given size of the gap 18 can be formed in the oriented metallic carbon nanotube.

As a method of forming the gap (nano gap) 18, the method of burning off part of the metallic carbon nanotube by a current has been described in this embodiment. However, the method is not limited thereto, and the gap 18 can be formed by microfabrication by using, for example, an atom force microscope (AFM) or the like.

Figure 5A:
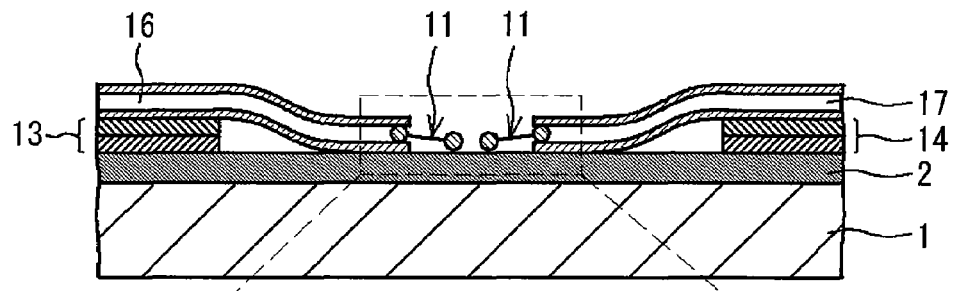
FIGS. 5A and 5B are cross sections showing a flow of steps of fabricating the functional device according to an embodiment.
Figure 5A:
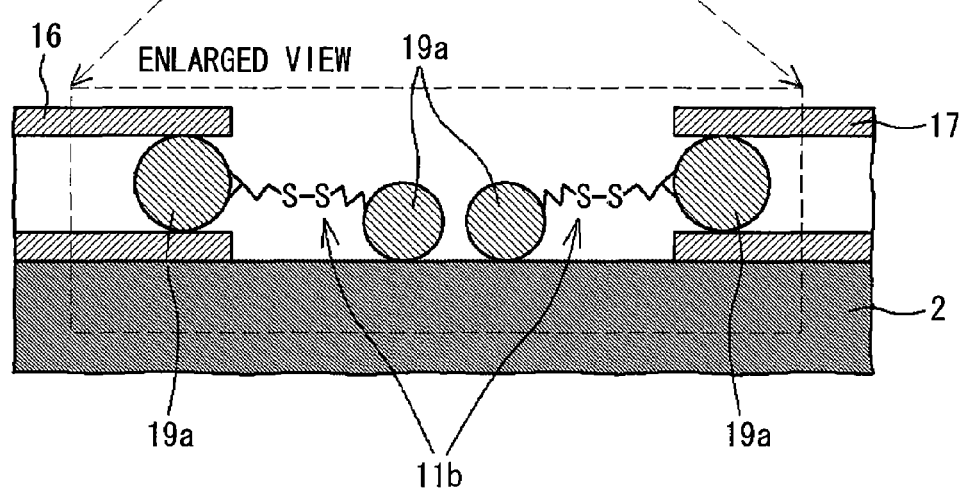

Next, as shown in FIG. 5A, at the openings of the metallic carbon nanotubes 16 and 17 facing the gap 18, the fullerene cores 19a as the one contained section and the other contained section which is included in conductive linkage group precursor molecules 11 as the first and the second conductive linkage group precursors are respectively contained in the metallic carbon nanotubes 16 and 17.

Figure 7:
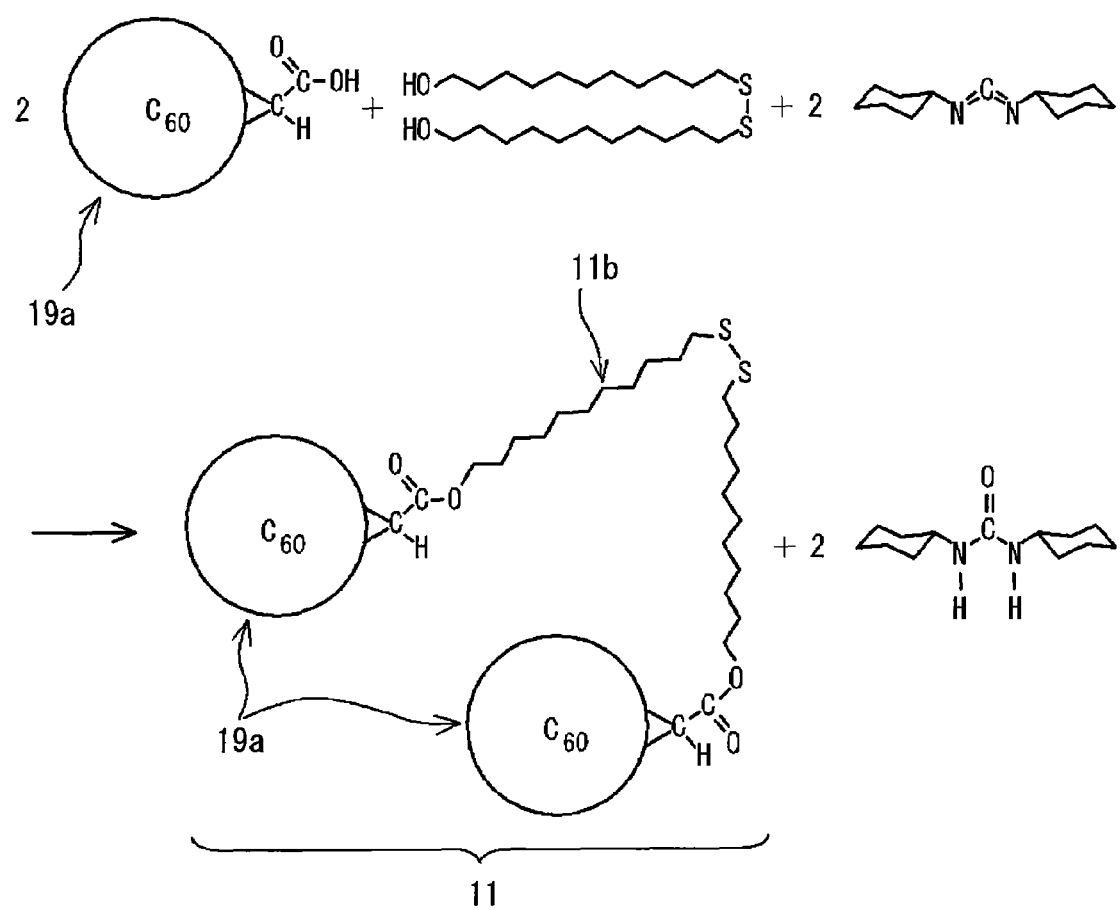
FIG. 7 is an explanation drawing showing a synthetic reaction of a conductive linkage group precursor molecule according to an embodiment.

Specifically, first, as shown in FIG. 7, the conductive linkage group precursor molecules 11 are synthesized. In the synthetic reaction, a fullerene derivative in which a carboxyl group is directly bonded to the fullerene core 19a such as $C_{60}$ via a methano group and dialkyl disulfide derivative having a hydroxyl group on the both ends of the molecule are esterification-reacted under the existence of a dehydrating agent. Thereby, dialkyl disulfide derivative in which the fullerene core 19a is bonded to the both ends of the molecule is synthesized as the conductive linkage group precursor molecule 11. Then, chloroform or the like is used as a solvent, and reaction is made under the conditions that the reaction temperature is kept at about room temperatures for about 48 hours.

Next, the conductive linkage group precursor molecule 11 is dissolved in an appropriate solvent such as toluene at a concentration of about 0.1 mM. After that, the metallic carbon nanotubes 16 and 17 are coated with the solution so that at least the openings of the metallic carbon nanotubes 16 and 17 facing the gap 18 are coated. When the resultant is kept in this state at about room temperatures for about 72 hours, the fullerene cores 19a of the conductive linkage group precursor molecule 11 are taken in the metallic carbon nanotubes 16 and 17. Then, disulfide group—S—S— contained in the conductive linkage group precursor group 11b formed as a molecular frame of the conductive linkage group precursor molecule 11 works as a stopper. Therefore, the conductive linkage group precursor molecule 11 is not endlessly taken in the metallic carbon nanotube 16 or 17.

Next, a dispersion liquid in which the conductive fine particle 19c such as gold being about 20 nm in diameter is dispersed in toluene or the like is added so that at least the opening of the metallic carbon nanotubes 16 and 17 facing the gap 18 is coated with the solution. Thereby, the conductive linkage group precursor molecule 11 in which the fullerene core 19a is taken in the metallic carbon nanotube 16 or 17 and the conductive fine particle 19c formed as the functional structural part are reacted. In the result, as shown in FIG. 5B, the functional structure 19 in which the fullerene core 19a is linked to the conductive fine particle 19c via the conductive linkage group 19b is formed.

Figure 8:
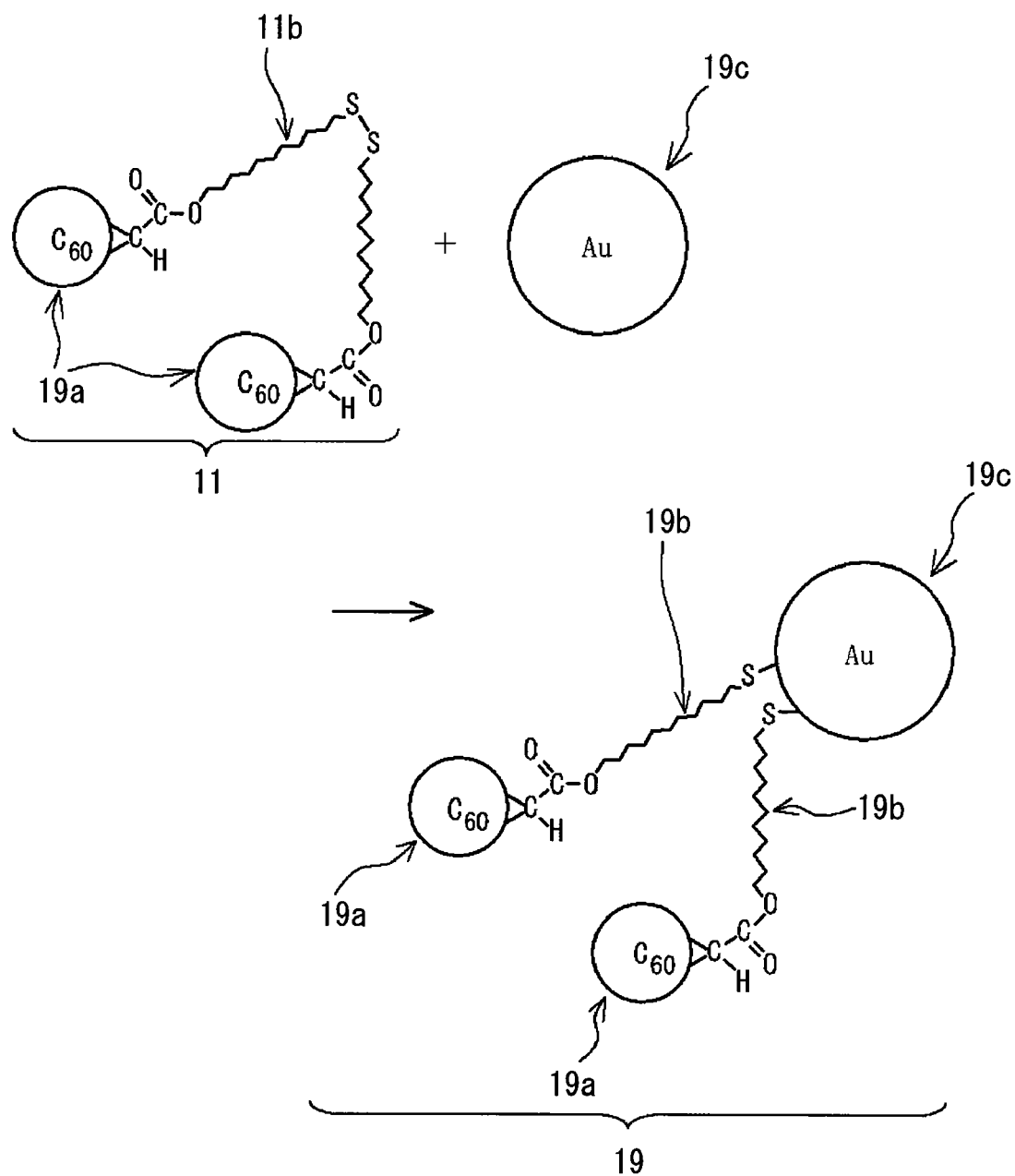
FIG. 8 is an explanation drawing showing reaction of forming a functional structure according to an embodiment.

FIG. 8 is an explanation drawing showing a reaction of forming the functional structure 19 by reaction between the conductive linkage group precursor molecule 11 and the conductive fine particle 19c. As shown in FIG. 8, when the disulfide group—S—S— included in the conductive linkage group precursor molecule 11 meets the conductive fine particle 19c such as gold, S—S bond is broken. Each of the broken conductive linkage group precursor group 11b is bonded to the conductive fine particle 19c to form the conductive linkage group 19b.

Figure 5B:
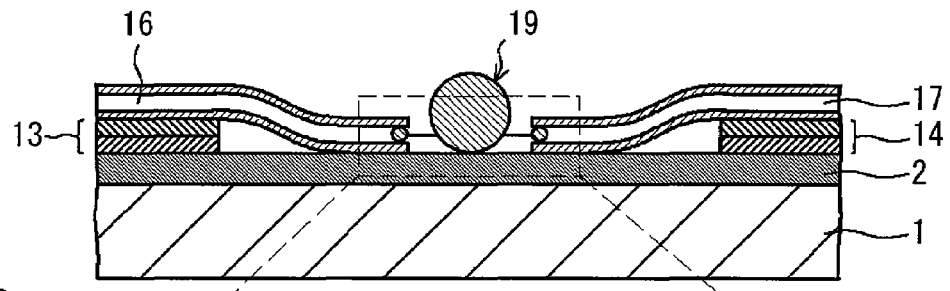
Figure 5B:
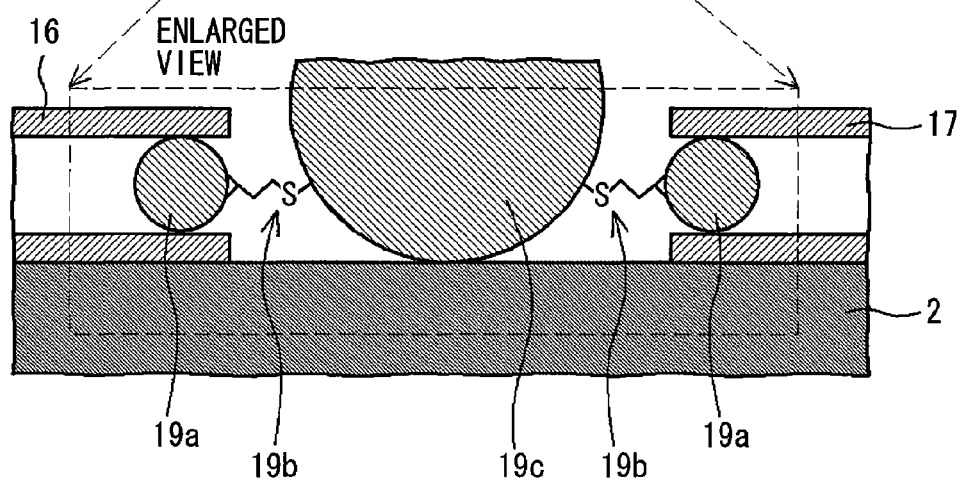

As shown in FIG. 5B, one of the two conductive linkage groups 19b formed from one conductive linkage group precursor molecule 11 is bonded to the fullerene core 19a contained in the metallic carbon nanotube 16 or 17 and thereby an effective electrically-conducting path in the functional structure 19 is formed. The other conductive linkage group 19b not shown in FIG. 5B is bonded to the conductive fine particle 19c, but does not function as an effective electrically-conducting path of the functional structure 19. Such a reaction is made at each of the openings of the metallic carbon nanotubes 16 and 17 to form the functional structure 19 shown in FIG. 5B.

A gold fine particle was added as the conductive fine particle 19c, and a voltage of 1 V was applied between the electrode 13 and the electrode 14 to measure conductivity before and after adding the gold fine particle. A current value between the electrodes was 15 fA before adding the gold fine particle and 1 mA after adding the gold fine particle. Therefore, it was confirmed that the metallic carbon nanotube 16 and the metallic carbon nanotube 17 are connected to each other by the functional structure 19 in the state as shown in FIG. 5B.

As described above, in this embodiment, the metallic carbon nanotube 15 can be selectively and effectively arranged so that the metallic carbon nanotube 15 contacts with the electrodes and bridges the clearance between the electrodes 13 and 14 by applying an AC voltage of an appropriate voltage with appropriate frequency between the electrode 13 and the electrode 14. Further, the gap 18 can be easily formed between the electrodes 13 and 14 by applying a slightly larger voltage between the electrodes 13 and 14. The functional structure 19 is retained between the metallic carbon nanotubes 16 and 17 which are formed by segmenting the metallic carbon nanotube 15 by the gap 18. Therefore, it is possible to easily resolve the task to arrange the nanometer-sized functional structure 19 in a given position and the task to make electrical connection for the nanometer-sized functional structure 19, which have been hardly resolved by the existing methods.

Further, the metallic carbon nanotubes 16 and 17 have superior conductivity. Further, as the contained section, the fullerene core 19a having an appropriate outer diameter corresponding to the internal diameter of the metallic carbon nanotubes 16 and 17 is used. Thereby, connection resistance between the functional structure 19 and the metallic carbon nanotubes 16 and 17 can be reduced. Further, once the fullerene core 19a is contained in the metallic carbon nanotube 16 or 17, the fullerene core 19a is hardly desorbed therefrom. Consequently, the functional structure 19 is electrically connected to the electrode 13 and the electrode 14 as an external electrode stably with small connection resistance.

Further, no complex chemical reaction is needed for synthesizing the conductive linkage group precursor molecule 11 composed of the fullerene core 19a and the conductive linkage group precursor group 11b, the step of containing the fullerene core 19a of the conductive linkage group precursor molecule 11 in the metallic carbon nanotube 16 or 17, and forming the functional structure 19 from the conductive linkage group precursor molecule 11 and the conductive fine particle 19c. Therefore, the functional structure 19 electrically connected to the metallic carbon nanotubes 16 and 17 can be easily formed. Further, in the flow of the manufacturing steps, only the reaction for forming the functional structure 19, which is the last step, may give constraints to the structural design of the functional structure 19. However, such a reaction is a special reaction which occurs only in a specific material such as a metal. Therefore, the method of manufacturing a functional device according to this embodiment can minimize the constraints given to the structural design of the functional structure 19.

SECOND ILLUSTRATIVE EXAMPLE

In another embodiment, a functional device structured as an insulated gate field effect transistor and a method of manufacturing it will be described. However, to avoid redundancy, a description will be given with an emphasis on points different from those of the first embodiment.

FIG. 9A is a plan view and FIG. 9B is a cross section of the functional device according to the second embodiment. FIG. 9B is a cross section taken along line 9b-9b of FIG. 9A. A partial enlarged view of a region indicated by dotted line is additionally shown.

As shown in FIGS. 9A and 9B, in the insulated gate field effect transistor according to this embodiment, a semiconductor substrate 21 such as a silicon substrate which is doped at a high concentration functions as a gate electrode as well. On the surface of the semiconductor substrate 21, an insulating layer such as a silicon oxide layer is formed as a gate insulating layer 22 by, for example, thermally oxidizing the silicon substrate.

The electrodes 13 and the electrode 14 as the opposed electrodes are pattern-formed on the gate insulating layer 22. The electrode 13 as a source electrode and the electrode 14 as a drain electrode are, for example, preferably composed of a two-layer structure of Ti/Pd in which a titanium (Ti) layer and a palladium (Pd) layer are layered in this order. This lamination structure achieves good contact characteristics to the gate insulating layer 22 as a base and favorable ohmic contact characteristics to the metallic carbon nanotubes 16 and 17. The distance between the electrode 13 and the electrode 14 is, for example, 1 to 2 μm.

The functional device includes the single-layer metallic carbon nanotube 16 as the first carbon nanotube, the single-layer metallic carbon nanotube 17 as the second carbon nanotube, and a functional structure 29. As described above, the metallic carbon nanotubes 16 and 17 are originally one metallic carbon nanotube (not shown) which is arranged so that the metallic carbon nanotube contacts with the electrode 13 and the electrode 14 and bridges the clearance therebetween, and are segmented into two by the gap (nano gap) 18. The length of the gap (nano gap) 18 is, for example, about 20 nm.

As shown in the partial enlarged view in FIG. 9B, the functional structure 29 includes two fullerene cores 29a such as $C_{60}$ as one contained section and the other contained section, two conductive linkage groups 29b, two fullerene cores 29c such as $C_{60}$, and a conductive carbon nanotube 29d as a functional structural part. Of the foregoing, the two fullerene cores 29a are respectively contained in the metallic carbon nanotubes 16 and 17. In the result, the functional structure 29 is retained between the metallic carbon nanotube 16 and the metallic carbon nanotube 17.

The semiconductive carbon nanotube 29d may be a general p-type carbon nanotube into which oxygen is absorbed, or an n-type carbon nanotube obtained by desorbing oxygen. Otherwise, the semiconductive carbon nanotube 29d may be a carbon nanotube which becomes a p-type carbon nanotube or an n-type carbon nanotube by containing other ion or other molecule.

A method of connecting the semiconductive carbon nanotube 29d to the conductive linkage group 29b is not particularly limited. In this embodiment, as an example, a method utilizing properties that a fullerene core is stably contained in a carbon nanotube is shown. In this method, the fullerene core 29c bonded to the conductive linkage group 29b is contained in the semiconductive carbon nanotube 29d, and the semiconductive carbon nanotube 29d and the conductive linkage group 29b are electrically connected. According to the method, the functional structure 29 can be easily and favorably formed.

When the functional device shown in FIGS. 9A and 9B functions as an insulated gate field effect transistor, conductivity in the semiconductive carbon nanotube 29d is controlled by a gate voltage applied to the semiconductor substrate 21 functioning as a gate electrode as well. A current corresponding to the conductivity comes in and out of the electrode 13 as a source electrode and the electrode 14 as a drain electrode. It is also possible to use the functional device as a fixed resistive element without applying a gate voltage, or as a variable resistive element by applying a gate voltage of a given voltage.

FIGS. 10A to 11B are cross sections showing a flow of steps of fabricating the functional device according to this embodiment.

First, as shown in FIG. 10A, the gate insulating layer 22 made of silicon oxide or the like is formed on the surface of the semiconductor substrate 21 such as a silicon substrate which is doped at a high concentration by thermal oxidation or the like. Next, an electrode material layer composed of, for example, a two-layer structure of Ti/Pd in which a titanium layer and a palladium layer are layered in this order is formed on the whole face. After that, patterning is provided by photolithography or the like to form the electrode 13 and the electrode 14 which are opposed to each other. The distance between the electrode 13 and the electrode 14 is, for example, 1 to 2 μm.

Next, as shown in FIG. 10B, in the same manner as in the first embodiment, the electrode 13, the electrode 14, and the insulating layer 2 between the electrodes 13 and 14 are coated with a dispersion liquid in which the metallic carbon nanotube 15 is dispersed in DMF. Then, the metallic carbon nanotube 15 is arranged so that the metallic carbon nanotube 15 contacts with the electrode 13 and the electrode 14 and bridges the clearance therebetween. Then, to selectively orient only the metallic carbon nanotube 15, the AC voltage of about 1 V with frequency of about 1 MHz is preferably applied between the electrode 13 and the electrode 14 for about 30 sec.

Next, as shown in FIG. 10C, in the same manner as in the first embodiment, the AC voltage of about 5 V with frequency of about 100 Hz is applied between the electrode 13 and the electrode 14 to burn off part of the metallic carbon nanotube 15. Thereby, the gap (nano gap) 18 is formed. In the result, the metallic carbon nanotube 15 is segmented into the metallic carbon nanotube 16 and the metallic carbon nanotube 17. The length of the gap (nano gap) 18 is, for example, about 20 nm.

Figure 11A:
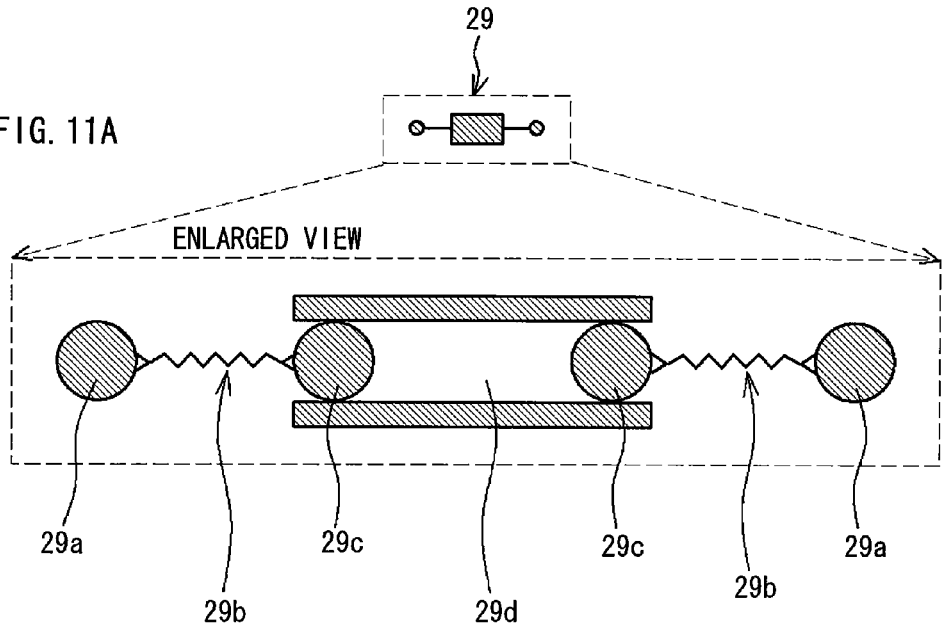
FIGS. 11A and 11B are cross sections showing a flow of steps of fabricating the functional device according to an embodiment.

Next, as shown in FIG. 11A, the functional structure 29 is separately synthesized.

Specifically, first, a conductive linkage molecule in which the fullerene core 29a such as $C_{60}$ and the fullerene core 29c such as $C_{60}$ are linked by the conductive linkage group 29b such as polydiacetylene group is synthesized. In the synthetic reaction, in the same manner as show in FIG. 7, a fullerene derivative in which a carboxyl group is directly bonded to the fullerene cores 19a and 19c such as $C_{60}$ via a methano group and the conducive linkage group 29b having a hydroxyl group on the both ends of the molecule are esterification-reacted under the existence of a dehydrating agent. Thereby, a conductive linkage molecule in which the fullerene cores 19a and 19c are bonded to the both ends of the conductive linkage group 29b is synthesized.

Next, the conductive linkage molecule is dissolved in an appropriate solvent. After that, the resultant is mixed with the semiconductive carbon nanotube 29d. The fullerene cores 19c of the conductive linkage molecule are contained in the both ends of the semiconductive carbon nanotube 29d to form the functional structure 29.

Figure 11B:
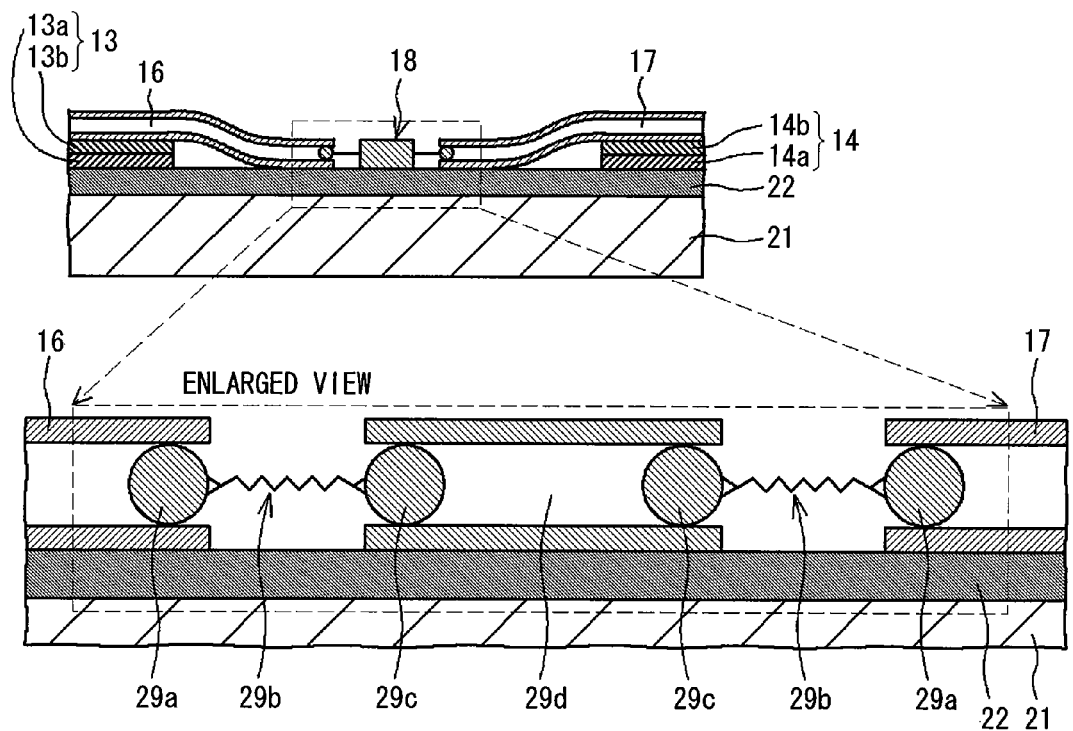

Next, as shown in FIG. 11B, the separately synthesized functional structure 29 is dispersed in an appropriate solvent. After that, the metallic carbon nanotubes 16 and 17 are coated with the dispersion liquid so that at least the openings of the metallic carbon nanotubes 16 and 17 facing the gap 18 are coated. Thereby, the fullerene core 19a of the functional structure 29 is taken in the metallic carbon nanotubes 16 and 17. Then, the functional structure 29 is retained between the carbon nanotubes 16 and 17, and the functional device of this embodiment is formed.

As in many cases in practice, when there is no large difference between the internal diameter of the metallic carbon nanotubes 16 and 17, and the internal diameter of the semiconductive carbon nanotube 29d, the fullerene core 19a may be identical with the fullerene core 19c. Thereby, the fabricating process becomes further simpler.

As described above, in this embodiment, the semiconductive carbon nanotube 29d is used as the functional structural part, and the gate electrode is provided on the substrate side with the gate insulating layer 22 in between. Thereby, the functional device functioning as an insulated gate field effect transistor can be easily obtained. The functional device can function as a fixed resistive element or as a variable resistive element according to the voltage applied to the gate electrode.

The functional device in this embodiment can provide operations and effects almost similar to those described in the first embodiment except for the foregoing description. That is, by applying an AC voltage of an appropriate voltage having appropriate frequency between the electrode 13 and the electrode 14, the metallic carbon nanotube 15 can be selectively and effectively arranged so that the metallic carbon nanotube 15 contacts with the electrodes 13 and 14 and bridges the clearance therebetween. Further, by applying a slightly larger voltage across the electrodes 13 and 14, the gap 18 can be easily formed therebetween. The functional structure 29 is retained between the metallic carbon nanotubes 16 and 17 which are produced by segmenting the metallic carbon nanotube 15 by the gap 18. Therefore, it is easily resolve the task to arrange the nanometer-sized functional structure 29 in a given position and the task to form electrical connection for the nanometer-sized functional structure 29, which have been hardly resolved by the existing methods.

Further, the metallic carbon nanotubes 16 and 17 have superior conductivity. Moreover, as the contained section, the fullerene core 29a having an appropriate outer diameter corresponding to the internal diameter of the metallic carbon nanotubes 16 and 17 is used. Thereby, connection resistance between the functional structure 29, and the metallic carbon nanotubes 16 and 17 can be reduced. Once the fullerene core 29a is contained in the metallic carbon nanotube 16 or 17, the fullerene core 29a is hardly desorbed therefrom. Consequently, the functional structure 29 is electrically connected to the electrode 13 and the electrode 14 stably with small connection resistance.

Further, no complex chemical reaction is needed for synthesizing the conductive linkage group molecule composed of the fullerene core 29a, the fullerene core 29c, and the conductive linkage group 29b, forming the functional structure 29 by containing the fullerene core 29c of the conductive linkage molecule in the semiconductive carbon nanotube 29d, and containing the fullerene core 29a of the functional structure 29 in the metallic carbon nanotubes 16 and 17. Therefore, the functional structure 29 electrically connected to the metallic carbon nanotubes 16 and 17 can be easily formed. Further, in the flow of the manufacturing steps, it is only the final two steps that may give constraints to the structural design of the functional structure 29. However, such two steps are the steps to contain the fullerene core in the carbon nanotube and do not include chemical reactions. Therefore, the method of manufacturing a functional device according to this embodiment can minimize the constraints given to the structural design of the functional structure 29.

Figure 12:
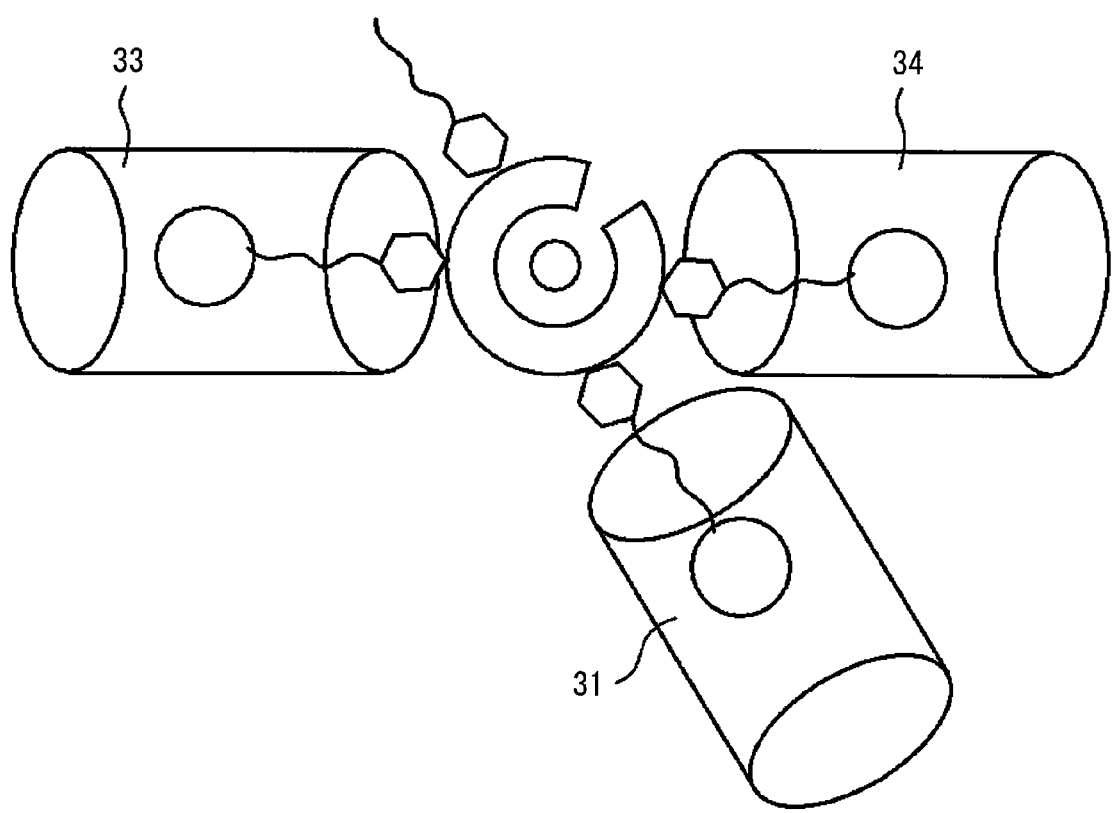
FIG. 12 is an explanation drawing showing another example of a functional device according to an embodiment.

FIG. 12 is an explanation drawing showing another example of the functional device according to the invention. As shown in FIG. 12, the functional device has a source electrode 33, a drain electrode 34, and a gate electrode 31 formed from a carbon nanotube in the same plane as the source electrode 33 and the drain electrode 34. The functional device is structured as an insulated gate field effect transistor as the functional device described in an embodiment.

Figure 13A:
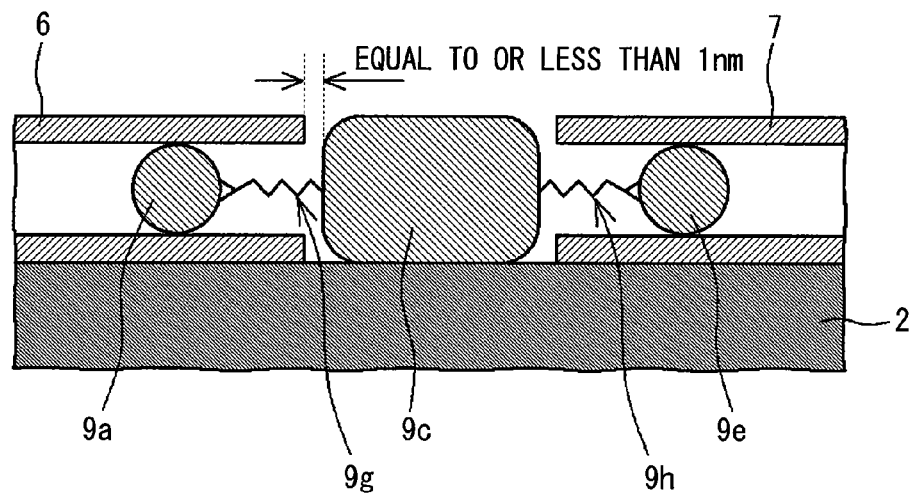
FIGS. 13A to 13C are explanation drawings showing still another example of a functional device according to an embodiment.

FIG. 13A is a cross section showing still another example of a functional device according to the invention and corresponds to the partial enlarged cross section of FIG. 1B. In the functional device shown in FIG. 1B, in the functional structure 9, the functional structural part 9c and the contained sections 9a and 9e are linked by the conductive linkage groups 9b and 9d, respectively. For realizing favorable electrical connection between the functional structural part 9c and the contained sections 9a and 9e, furthermore between the functional structural part 9c and the carbon nanotubes 6 and 7, it is preferable that the linkage group is conductive.

However, it is not absolutely necessary that the linkage group has conductivity for realizing functions of the functional device. For example, as the contained sections 9a and 9e such as fullerene are deeply taken into the carbon nanotubes 6 and 7, the distance between the functional structural part 9c and the openings of the carbon nanotubes 6 and 7 becomes gradually small. When the distance becomes 1 nm or less, a tunnel current starts to flow between the functional structural part 9c and the carbon nanotubes 6 and 7. The functional device shown in FIG. 13A is a device which shows its function by a tunnel current. In this case, the characteristics thereof do not depend on the magnitude of conductivity of linkage groups 9g and 9h. Therefore, compared to the case where conductivity for linkage groups is necessary, there is an advantage that the linkage groups 9g and 9h can be selected from much more options.

Figure 13B:
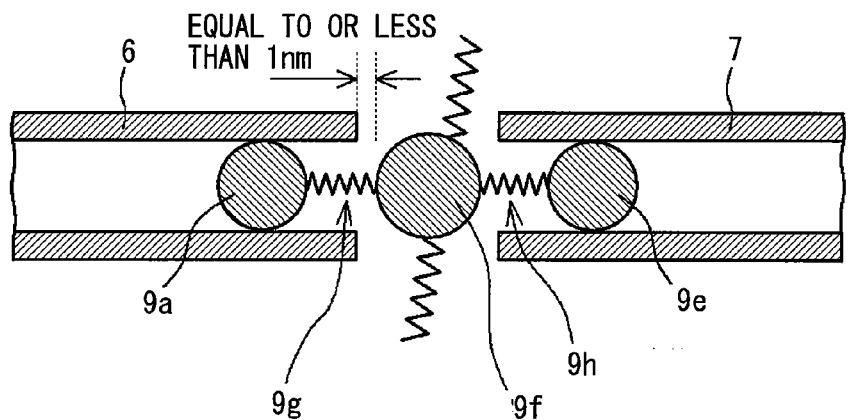

FIG. 13B corresponds to FIG. 2. FIG. 13B shows an example that the foregoing method of connecting the functional structural part 9c to the carbon nanotubes 6 and 7 by a tunnel current to the case that the functional structural part 9c is an active device such as a molecular switch 9f. As in the functional device shown in FIG. 13A, there is an advantage that the linkage groups 9g and 9h can be selected from many options.

Figure 13C:
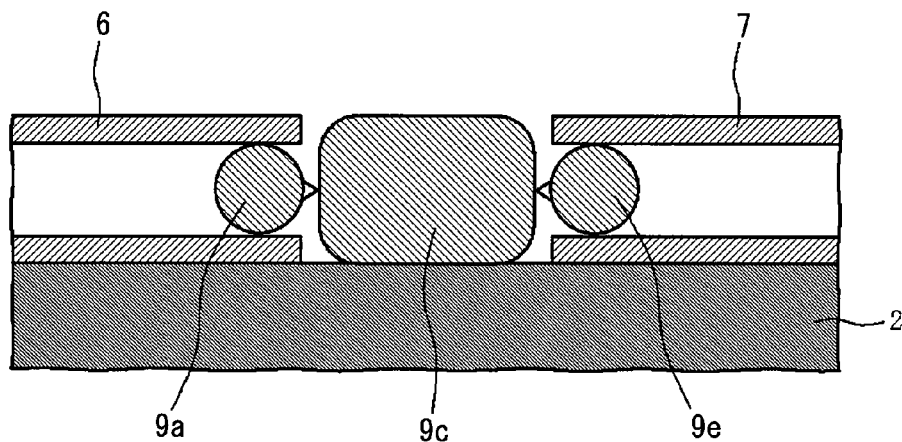

FIG. 13C is a cross section showing still another example of a functional device according to the invention. As FIG. 13A, FIG. 13C corresponds to the partial enlarged cross section of FIG. 1B. In the functional device shown in FIG. 13C, in the functional structure 9, the functional structural part 9c and the contained sections 9a and 9e are directly bonded without via linkage groups, and thus the characteristics thereof do not depend on linkage groups.

According to the functional device using a carbon nanotube as a wiring material and the method of manufacturing same, the difficult task to arrange a nanometer-sized functional structure in a given position and forming a wiring in it, which has been difficult to be resolved in the past, can be resolved. Furthermore, nanometer-sized next generation functional devices such as a resistor, a switch, and a transistor can be realized.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A functional device comprising:
   a functional structure having contained sections in positions spaced from each other is retained by a single layer carbon nanotube, wherein
   a gap is formed in the carbon nanotube, and the carbon nanotube is segmented into a first carbon nanotube and a second carbon nanotube by the gap, and
   one of the contained sections is contained in the first carbon nanotube at an opening of the first carbon nanotube facing the gap, and the other of the contained sections is contained in the second carbon nanotube at an opening of the second carbon nanotube facing the gap.

2. The functional device according to claim 1, wherein the functional structure has fullerene cores at both ends of the functional structure as the contained sections is retained by a metallic carbon nanotube, wherein
   the metallic carbon nanotube is arranged so that the metallic carbon nanotube contacts with opposed electrodes, and bridges at least a clearance between the electrodes,
   the gap is formed in the metallic carbon nanotube between the opposed electrodes, and
   one of the fullerene cores is contained in the first carbon nanotube at the opening of the first carbon nanotube facing the gap, and the other of the fullerene cores is contained in the second carbon nanotube at the opening of the second carbon nanotube facing the gap.

3. The functional device according to claim 2 which is structured as a resistive element.

4. The functional device according to claim 3, wherein the functional structure includes a fine particle composed of any one of a metal and a semiconductor, the fullerene core, and a conductive linkage group for linking the fine particle to the fullerene core.

5. The functional device according to claim 3, wherein the functional structure includes a fine particle composed of any one of a metal and a semiconductor, the fullerene core, and a linkage group for linking the fine particle to the fullerene core.

6. The functional device according to claim 3, wherein the functional structure includes a fine particle composed of any one of a metal and a semiconductor and the fullerene core directly bonded thereto.

7. The functional device according to claim 2 which is structured as an active device capable of controlling conductivity.

8. The functional device according to claim 7 which is structured as a switch.

9. The functional device according to claim 7 which is structured as an insulated gate field effect transistor in which a gate electrode is provided in a region between the opposed electrodes, and conductivity of the functional structure is controlled by potential of the gate electrode.

10. The functional device according to claim 9, wherein the functional structure includes a semiconductive carbon nanotube, the fullerene core, and a conductive linkage gr oup for linking the semiconductive carbon nanotube to the fullerene core.

* * * * *